(12) United States Patent
Hsu et al.

(10) Patent No.: US 11,721,591 B2
(45) Date of Patent: Aug. 8, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chih-Kai Hsu, Tainan (TW); Ssu-I Fu, Kaohsiung (TW); Chun-Ya Chiu, Tainan (TW); Chi-Ting Wu, Tainan (TW); Chin-Hung Chen, Tainan (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/338,666

(22) Filed: Jun. 4, 2021

(65) Prior Publication Data

US 2021/0296182 A1 Sep. 23, 2021

Related U.S. Application Data

(60) Division of application No. 16/807,108, filed on Mar. 2, 2020, now Pat. No. 11,062,954, which is a
(Continued)

(51) Int. Cl.
*H01L 29/06* (2006.01)
*H01L 21/8234* (2006.01)
*H01L 27/088* (2006.01)

(52) U.S. Cl.
CPC ........ *H01L 21/823481* (2013.01); *H01L 21/823431* (2013.01); *H01L 27/0886* (2013.01); *H01L 29/0649* (2013.01)

(58) Field of Classification Search
CPC ......... H01L 29/06; H01L 29/66; H01L 29/78; H01L 29/0649; H01L 29/0653; H01L 29/785; H01L 29/7843; H01L 29/7846; H01L 29/4848; H01L 29/7851; H01L 29/66545; H01L 29/66795; H01L 27/088; H01L 27/0886; H01L 27/092; H01L 27/0924; H01L 27/0922; H01L 27/10826; H01L 27/10879; H01L 21/02; H01L 21/0217; H01L 21/762; H01L 21/764; H01L 21/76224; H01L 21/8234;
(Continued)

(56) References Cited

U.S. PATENT DOCUMENTS 8,609,510 B1 12/2013 Banna et al.
9,123,773 B1 9/2015 Shen
(Continued)

OTHER PUBLICATIONS

Lin, the specification, including the claims, and drawings in the U.S. Appl. No. 15/859,775, filed Jan. 2, 2018.

*Primary Examiner* — Chuong A Luu
(74) *Attorney, Agent, or Firm* — Winston Hsu

(57) ABSTRACT

A method for fabricating semiconductor device includes the steps of: providing a substrate having a fin-shaped structure thereon; forming a single diffusion break (SDB) structure in the substrate to divide the fin-shaped structure into a first portion and a second portion; forming a first gate structure on the SDB structure; forming an interlayer dielectric (ILD) layer around the first gate structure; transforming the first gate structure into a first metal gate; removing the first metal gate to form a first recess; and forming a dielectric layer in the first recess.

5 Claims, 10 Drawing Sheets

Related U.S. Application Data continuation-in-part of application No. 15/873,838, filed on Jan. 17, 2018, now Pat. No. 10,607,882.

(58) Field of Classification Search
CPC ......... H01L 21/8238; H01L 21/823431; H01L 21/823481; H01L 21/823821; H01L 21/823842; H01L 21/823878
USPC ....................................................... 257/401
See application file for complete search history.

(56) References Cited

U.S. PATENT DOCUMENTS

| | | |
|---|---|---|
| 9,171,752 B1 | 10/2015 | Wu |
| 9,368,496 B1* | 6/2016 | Yu ..................... H01L 29/7855 |
| 9,412,616 B1 | 8/2016 | Xie |
| 9,953,880 B1 | 4/2018 | Lin |
| 10,607,882 B2 | 3/2020 | Hsu |
| 11,062,954 B2 | 7/2021 | Hsu |
| 2013/0140639 A1 | 6/2013 | Shieh et al. |
| 2016/0049468 A1* | 2/2016 | Wu .................... H01L 27/0886 |
| | | 257/401 |
| 2016/0111524 A1 | 4/2016 | Ha |
| 2016/0225762 A1 | 8/2016 | Zang |
| 2017/0141211 A1* | 5/2017 | Xie .................. H01L 21/76224 |
| 2017/0278925 A1 | 9/2017 | Peng |
| 2019/0006360 A1 | 1/2019 | Tung |
| 2019/0043964 A1 | 2/2019 | Lin |
| 2019/0172753 A1 | 6/2019 | Lin |

\* cited by examiner

SEMICONDUCTOR DEVICE AND METHOD FOR FABRICATING THE SAME

CROSS REFERENCE TO RELATED APPLICATIONS

This application is a division of U.S. application Ser. No. 16/807,108 filed Mar. 2, 2020, which is a continuation-in-part application of U.S. application Ser. No. 15/873,838, filed on Jan. 17, 2018, all of which are hereby incorporated by reference in their entirety.

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: providing a substrate having a fin-shaped structure thereon; forming a single diffusion break (SDB) structure in the substrate to divide the fin-shaped structure into a first portion and a second portion; forming a first gate structure on the SDB structure; forming an interlayer dielectric (ILD) layer around the first gate structure; transforming the first gate structure into a first metal gate; removing the first metal gate to form a first recess; and forming a dielectric layer in the first recess.

According to another aspect of the present invention, a semiconductor device includes a single diffusion break (SDB) structure dividing a fin-shaped structure into a first portion and a second portion and an isolation structure on the SDB structure. Preferably, the isolation structure comprises a T-shape or more specifically T-shape cross-section.

According to yet another aspect of the present invention, a semiconductor device includes a single diffusion break (SDB) structure dividing a fin-shaped structure into a first portion and a second portion, an isolation structure on the SDB structure, and a first spacer adjacent to the isolation structure. Preferably, a top surface of the first spacer is lower than a top surface of the isolation structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
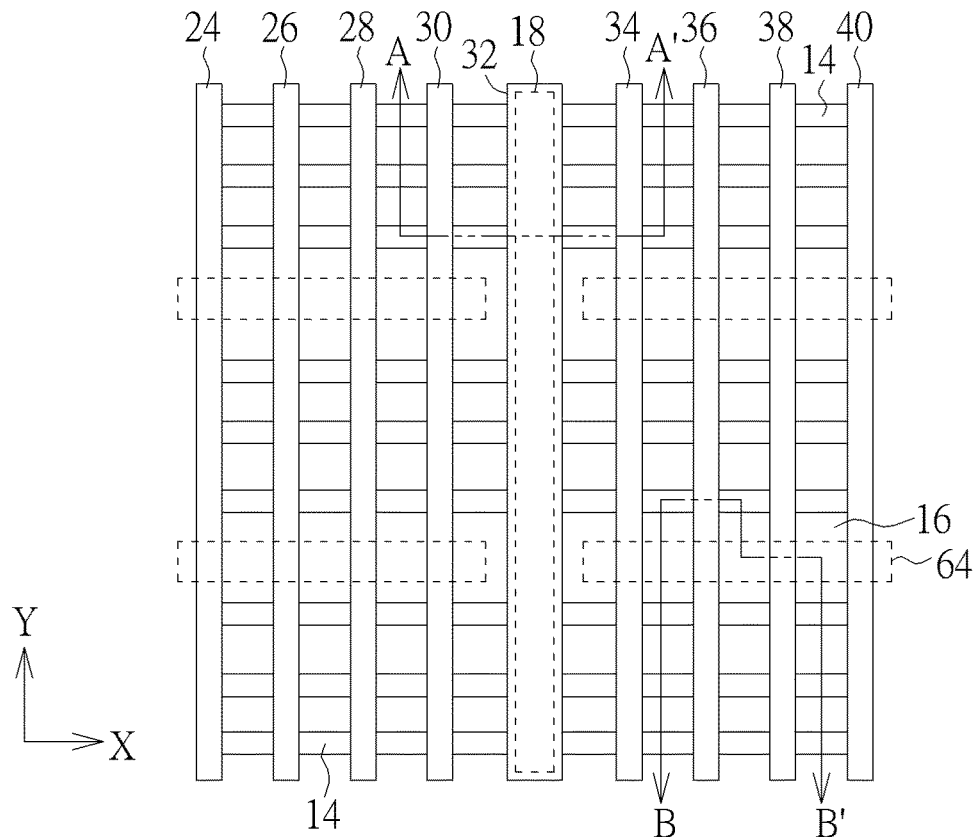
FIGS. 1-6 illustrate a method for fabricating a semiconductor device according to an embodiment of the present invention.
Figure 2:
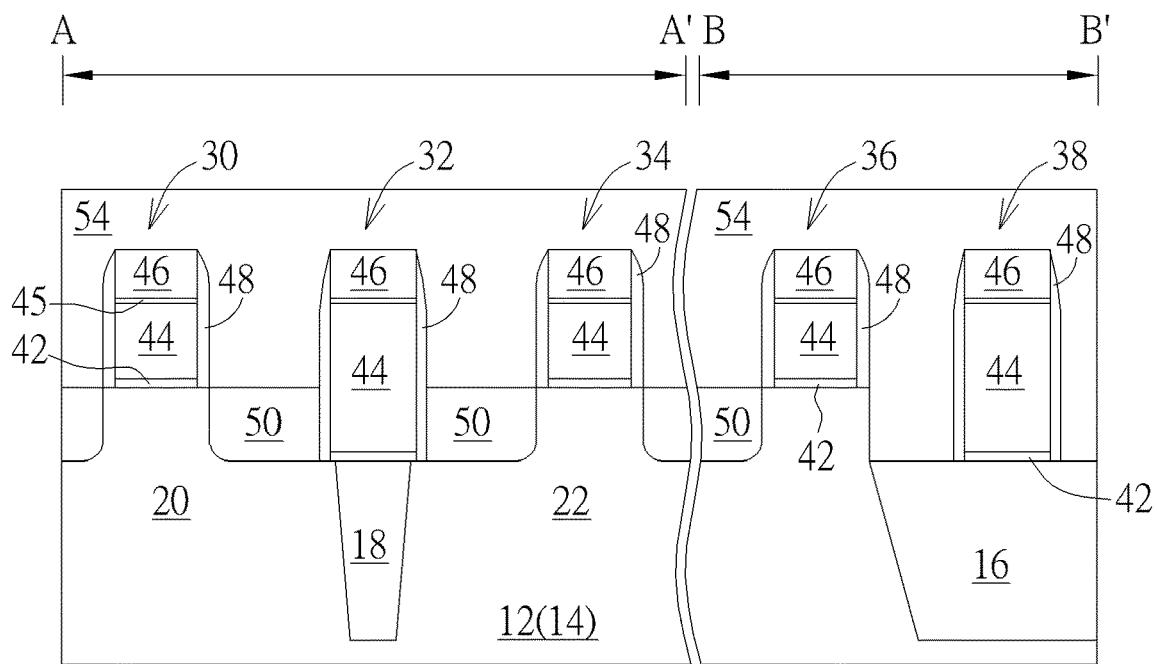

Referring to FIGS. 1-6, FIGS. 1-6 illustrate a method for fabricating a semiconductor device according to an embodiment of the present invention, in which FIG. 1 is a top view illustrating a method for fabricating the semiconductor device, left portions of FIGS. 2-6 illustrate cross-sectional views of FIG. 1 for fabricating the semiconductor device along the sectional line AA', and right portions of FIGS. 2-6 illustrate cross-sectional views of FIG. 1 for fabricating the semiconductor device along the sectional line BB'. As shown in FIGS. 1-2, a substrate 12, such as a silicon substrate or silicon-on-insulator (SOI) substrate is first provided, and a plurality of fin-shaped structures 14 are formed on the substrate 12. It should be noted that even though nine fin-shaped structures 14 are disposed on the substrate 12 in this embodiment, it would also be desirable to adjust the number of fin-shaped structures 14 depending on the demand of the product, which is also within the scope of the present invention.

Preferably, the fin-shaped structures 14 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structure are all within the scope of the present invention.

Next, a shallow trench isolation (STI) 16 is formed around the fin-shaped structures 14. In this embodiment, the formation of the STI 16 could be accomplished by conducting a flowable chemical vapor deposition (FCVD) process to form a silicon oxide layer on the substrate 12 and covering the fin-shaped structures 14 entirely. Next, a chemical mechanical polishing (CMP) process along with an etching process are conducted to remove part of the silicon oxide layer so that the top surface of the remaining silicon oxide is slightly lower than the top surface of the fin-shaped structures 14 for forming the STI 16.

After the STI structure 16 is formed, a single diffusion break (SDB) structure 18 is formed in the substrate 12 to divide each of the fin-shaped structures 14 into a first portion 20 and a second portion 22. Preferably, the formation of the SDB structure 18 could be accomplished by conducting a photo-etching process to remove part of the fin-shaped structures 14 for forming a recess, forming a dielectric layer into the recess, and then conducting a planarizing process such as CMP with optional etching back process to remove part of the dielectric layer so that the top surface of the remaining dielectric layer is slightly lower than the top surface of the divided fin-shaped structures 14. As shown in FIG. 1, the fin-shaped structures 14 are disposed extending along a first direction (such as X-direction) and the SDB structure 18 is disposed extending along a second direction (such as Y-direction), in which the SDB structure 18 preferably separates each of the fin-shaped structures 14 into two portions, including a first portion 20 on the left side of the SDB structure 18 and a second portion 22 on the right side of the SDB structure 18.

It should be noted that even though the SDB structure 18 is formed after the STI 16 in this embodiment, the SDB structure 18 could also be formed at the same time with the STI 16, which is also within the scope of the present invention. If the STI 16 and the SDB structure 18 were formed at the same time, the two elements would preferably be made of dielectric material including but not limited to for example silicon oxide. Nevertheless, if the SDB structure 18 were formed after the STI 16, the STI 16 would preferably be made of silicon oxide while the SDB structure 18 could be made of either silicon oxide or silicon nitride. In other words, the STI 16 and the SDB structure 18 could be selected from the group consisting of silicon oxide and silicon nitride while the STI 16 and the SDB structure 18 could be made of same material or different material depending on the demand of the process, which are all within the scope of the present invention.

Next, gates structures 24, 26, 28, 30, 32, 34, 36, 38, 40 or dummy gates are formed on the fin-shaped structure 14 and the STI 16, in which the left portion of FIG. 2 illustrates gate structures 30, 34 disposed on the fin-shaped structure 14 and gate structure 32 disposed directly on top of the SDB structure 18 while the right portion of FIG. 2 illustrates a gate structure 36 adjacent to an edge of the fin-shaped structure 14 and a portion of the gate structure 38 standing directly on top of the STI 16. In this embodiment, the formation of the gate structures 24, 26, 28, 30, 32, 34, 36, 38, 40 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, and at least a selective hard mask could be formed sequentially on the substrate 12, and a photo-etching process is then conducted by using a patterned resist (not shown) as mask to remove part of the hard mask, part of the gate material layer, and part of the gate dielectric layer through single or multiple etching processes. After stripping the patterned resist, gate structures 24, 26, 28, 30, 32, 34, 36, 38, 40 each composed of a patterned gate dielectric layer 42, a patterned material layer 44, a hard mask 45, and a hard mask 46 are formed on the fin-shaped structure 14, the SDB structure 18, and the STI 16. Specifically, a dual hard mask structure composed of a hard mask 45 and another hard mask 46 is disposed on top of the patterned material layer 44 in this embodiment, in which the hard mask 45 is preferably made of silicon oxide and the hard mask 46 is made of silicon nitride. Nevertheless, according to an embodiment of the present invention, the hard masks 45 and 46 could also be made of different material while the two hard masks 45, 46 could be selected from the group consisting of silicon oxide and silicon nitride, which are all within the scope of the present invention.

Next, at least a spacer 48 is formed on the sidewalls of the each of the gate structures 24, 26, 28, 30, 32, 34, 36, 38, 40, a source/drain region 50 and/or epitaxial layer (not shown) is formed in the fin-shaped structure 14 adjacent to two sides of the spacer 48, and selective silicide layers (not shown) could be formed on the surface of the source/drain regions 50. In this embodiment, the spacer 48 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 50 could include n-type dopants or p-type dopants depending on the type of device being fabricated. Next, a selective contact etch stop layer (CESL) (not shown) is formed on the gate structures 24, 26, 28, 30, 32, 34, 36, 38, 40 and the STI 16, and an interlayer dielectric (ILD) layer 54 is formed on the CESL.

Figure 3:
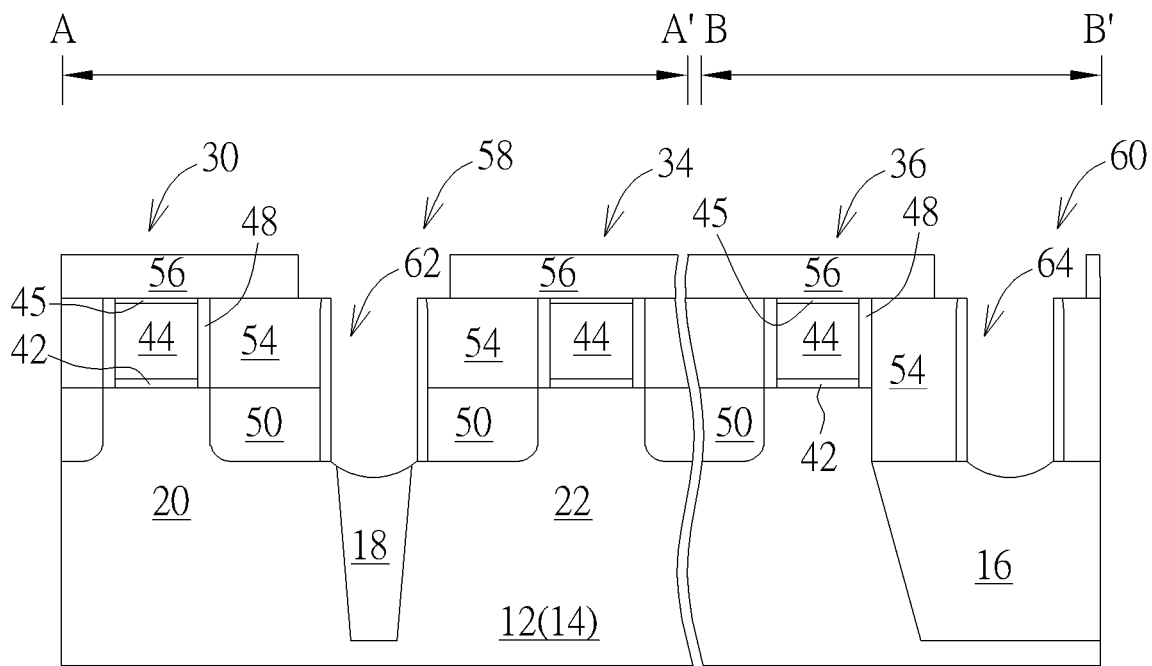

Next, as shown in FIG. 3, a planarizing process such as CMP is conducted to remove part of the ILD layer 54, the hard masks 46, and part of the spacers 48 so that the top surfaces of the hard masks 45 and the remaining ILD layer 54 are coplanar. Next, a patterned mask 56 is formed on the ILD layer 54, in which the patterned mask 56 includes openings 58, 60 to expose the top surface of the gate structures 32 and 38. In this embodiment, the patterned mask 56 could be a tri-layered structure including an organic dielectric layer (ODL), a silicon-containing hard mask bottom anti-reflective coating (SHB), and a patterned resist and the step of forming the openings 58, 60 in the patterned mask 56 could be accomplished by using the patterned resist as mask to remove part of the SHB and part of the ODL.

Next, an etching process is conducted by using the patterned mask 56 as mask to remove the hard masks 45 and the patterned material layers 44 of the gate structures 32, 38 for forming a first recess 62 exposing the SDB structure 18 and a second recess 64 exposing the STI 16. As shown in FIGS. 2-3, it should be noted that the first recess 62 formed at this stage is extending along the same direction (such as Y-direction) as the SDB structure 18 underneath while the second recess 64 is formed extending along a different X-direction to divide gate structures 24, 26, 28, 30 and gate structures 34, 36, 38, 40 into smaller segments.

It should further be noted that the depths of the first recess 62 and the second recess 64 could be the same or different depending on the demand of the SDB structure 18 and STI 16 underneath. For instance, if the SDB structure 18 were made of silicon nitride while the STI 16 were made of silicon oxide, the bottom surface of the first recess 62 formed afterwards could be slightly lower or higher than the bottom surface of the second recess 64 depending on the etchant used during the etching process and if both the SDB structure 18 and STI 16 were made of same material such as silicon oxide, the bottom surfaces of the two recesses 62, 64 would preferably be coplanar.

Figure 4:
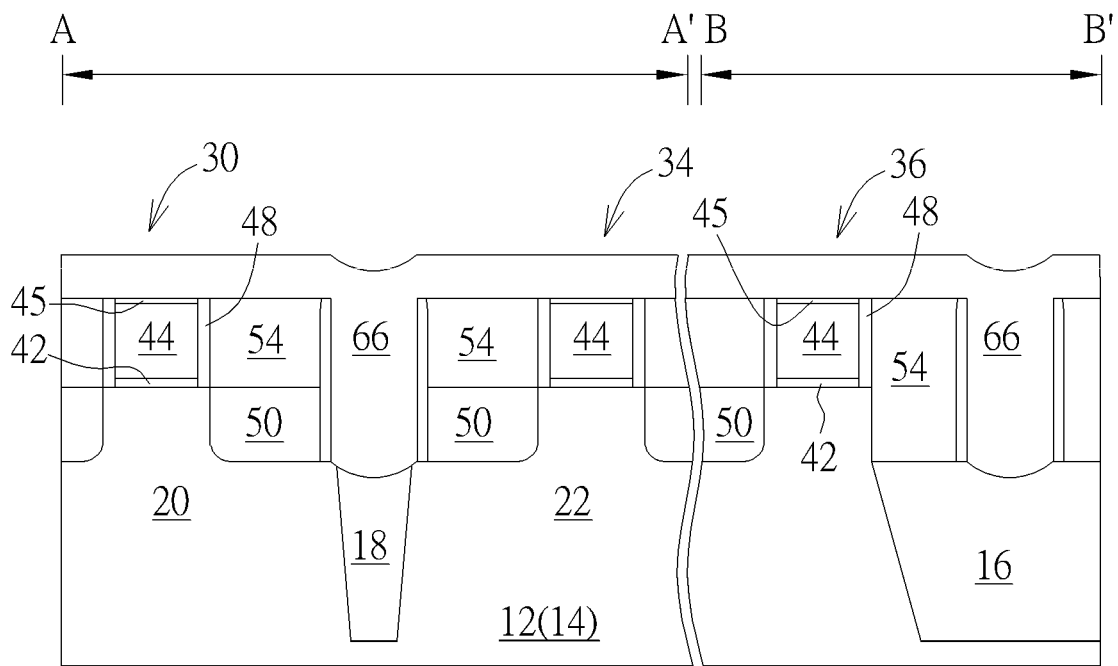

Next, as shown in FIG. 4, a dielectric layer 66 is formed in the first recess 62 and the second recess 64 at the same time to fill the first recess 62 and second recess 64 completely. In this embodiment, the dielectric layer 66 could be made of dielectric material including but not limited to for example silicon dioxide ($SiO_2$), silicon oxycarbide (SiOC), silicon nitride, or combination thereof.

Figure 5:
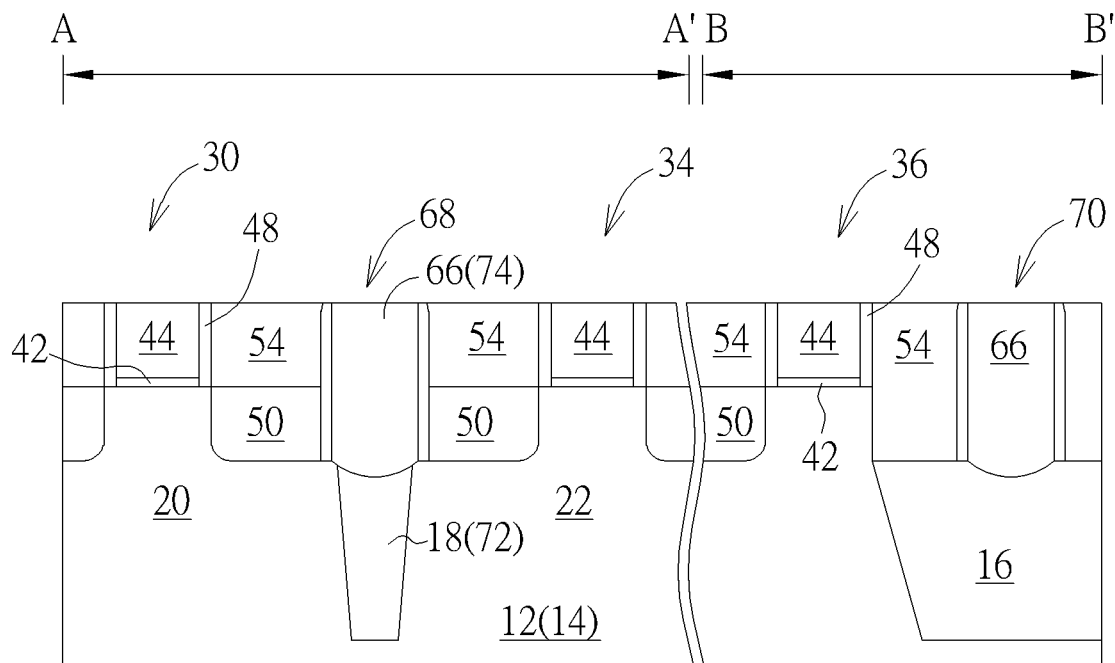

Next, as shown in FIG. 5, a planarizing process such as CMP is conducted to remove part of the dielectric layer 66, the hard masks 45, and even part of the ILD layer 54 and part of the CESL to form another SDB structure 68 between the gate structures 30, 34 and an isolation structure 70 on top of the STI 16 and adjacent to the gate structure 36, in which the top surfaces of the SDB structure 68, the isolation structure 70, and the ILD layer 54 are coplanar.

Preferably, the new SDB structure 68 includes a bottom portion 72 embedded within the fin-shaped structure 14 and a top portion 74 on the bottom portion 72. Preferably, the top portion 74 of the SDB structure 68, the bottom portion 72 of the SDB structure 68, the isolation structure 70, and the STI 16 could be selected from the group consisting of $SiO_2$, SiOC, and SiN while the top portion 74 and the bottom portion 72 could be made of same material or different material, the STI 16 and the isolation structure 70 could be made of same material or different material, or the STI 16 and the bottom portion 72 of the SDB structure 68 could be made of same material or different material.

For instance, the bottom portion 72 of the SDB structure 68 could be made of silicon nitride while the top portion 74 is made of silicon dioxide, the bottom portion 72 could be made of silicon dioxide while the top portion 74 is made of silicon nitride or SiOC, both the bottom portion 72 and the top portion 74 could be made of either silicon dioxide or silicon nitride, the STI 16 could be made of silicon dioxide while the isolation structure 70 is made of silicon nitride, the STI 16 could be made of silicon dioxide while the isolation structure 70 is made of SiOC, the STI 16 could be made of silicon dioxide while the bottom portion 72 is made of silicon nitride and the top portion 74 and the isolation structure 70 are made of SiOC, or the STI 16 and the bottom portion 72 could be made of silicon dioxide while the top portion 74 and the isolation structure 70 are made of silicon nitride or SiOC, which are all within the scope of the present invention.

Figure 6:
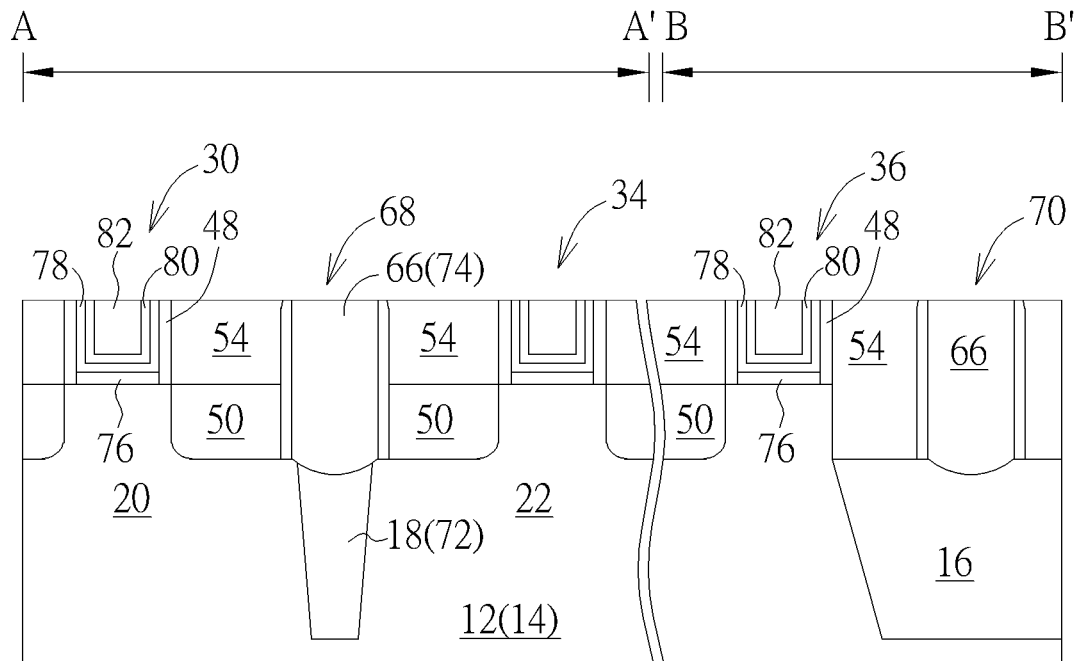

After the new SDB structure 68 and isolation structure 70 are formed, as shown in FIG. 6, a replacement metal gate (RMG) process is conducted to transform the gate structures 24, 26, 28, 30, 32, 34, 36, 38, 40 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 44 and even gate dielectric layer 42 from each of the gate structures 24, 26, 28, 30, 32, 34, 36, 38, 40 for forming recesses (not shown) in the ILD layer 54.

Next, a selective interfacial layer 76 or gate dielectric layer (not shown), a high-k dielectric layer 78, a work function metal layer 80, and a low resistance metal layer 82 are formed in the recesses, and a planarizing process such as CMP is conducted to remove part of low resistance metal layer 82, part of work function metal layer 80, and part of high-k dielectric layer 78 to form metal gates. In this embodiment, the gate structures 30, 34, 36 or metal gates fabricated through high-k last process of a gate last process preferably includes an interfacial layer 76 or gate dielectric layer (not shown), a U-shaped high-k dielectric layer 78, a U-shaped work function metal layer 80, and a low resistance metal layer 82.

In this embodiment, the high-k dielectric layer 78 is preferably selected from dielectric materials having dielectric constant (k value) larger than 4. For instance, the high-k dielectric layer 78 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 80 is formed for tuning the work function of the metal gate in accordance with the conductivity of the device. For an NMOS transistor, the work function metal layer 80 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 80 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 80 and the low resistance metal layer 82, in which the material of the barrier layer may include titanium (Ti), titanium nitride (TiN), tantalum (Ta) or tantalum nitride (TaN). Furthermore, the material of the low-resistance metal layer 82 may include copper (Cu), aluminum (Al), titanium aluminum (TiAl), cobalt tungsten phosphide (CoWP) or any combination thereof.

Figure 7:
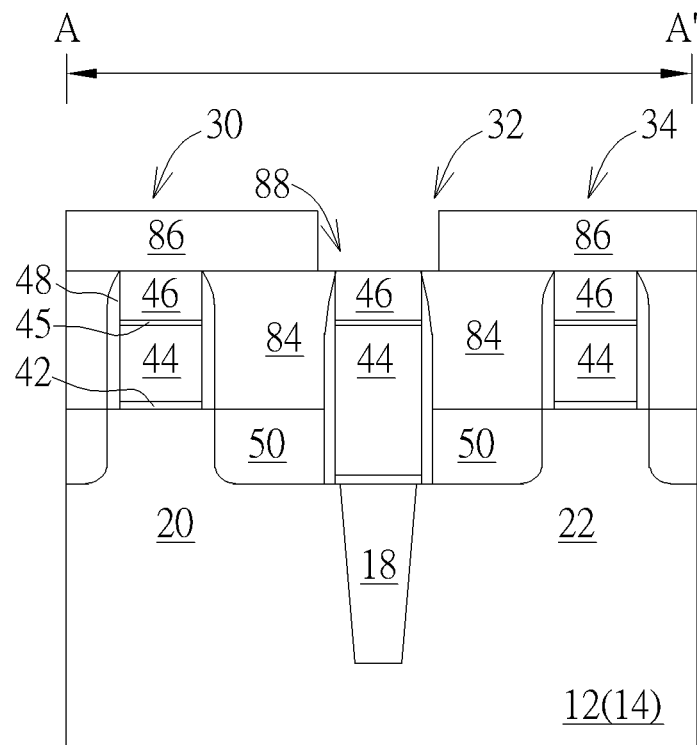
FIGS. 7-10 illustrate a method for fabricating a semiconductor device according to an embodiment of the present invention.

Referring to FIGS. 7-10, FIGS. 7-10 illustrate a method for fabricating a semiconductor device along the sectional line AA' of FIG. 1 according to an embodiment of the present invention. As shown in FIG. 7, it would be desirable to follow the fabrication process as disclosed in FIG. 2 to first form a SDB structure 18 in the substrate 12 to divide the fin-shaped structure 14 into two portions 20, 22, gate structures 30, 34 on the fin-shaped structure 14, and a gate structure 32 directly on the SDB structure 18. Preferably, each of the gate structures 30, 32, 34 is composed of a patterned gate dielectric layer 42, a patterned material layer 44, and a hard mask 46, a spacer 48 is formed on the sidewalls of each of the gate structures 30, 32, 34, a source/drain region 50 and/or epitaxial layer is formed in the fin-shaped structure 14 adjacent to two sides of the spacer 48, and selective silicide layers (not shown) could be formed on the surface of the source/drain regions 50. The composition of each of the spacers 48 and the source/drain region 50 could be the same as the ones disclosed in the aforementioned embodiment and the details of which are not explained herein for the sake of brevity.

After the source/drain regions 50 are formed, instead of forming an ILD layer to cover the gate structures 30, 32, 34, a mask layer 84 is formed on and around the gate structures 30, 32, 34 and a patterned mask 86 such as patterned resist is formed on the gate structures 30, 32, 34 and the mask layer 84, in which the patterned mask 86 includes an opening 88 exposing the hard mask 46 of the gate structure 32 directly on top of the SDB structure 18. In this embodiment, the mask layer 84 is preferably made of bottom anti-reflective coating (BARC), but not limited thereto.

Figure 8:
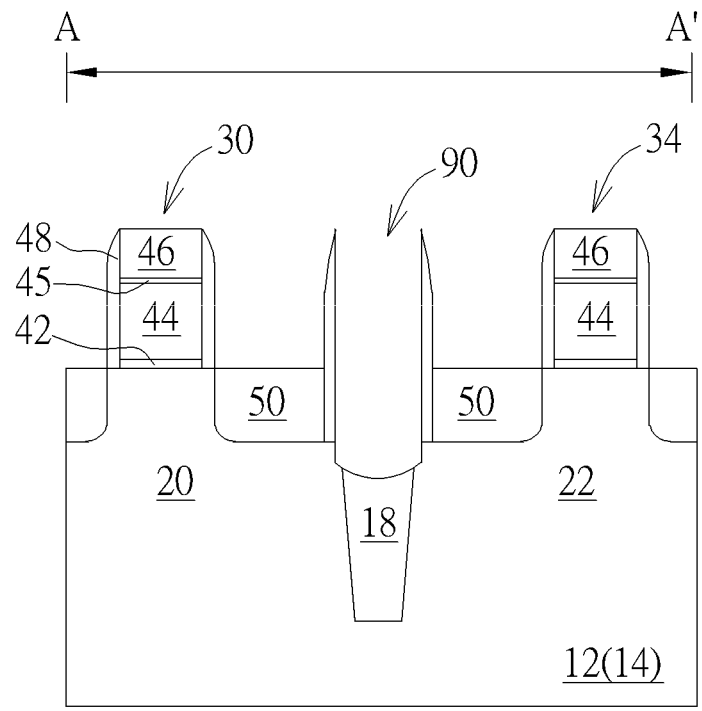

Next, as shown in FIG. 8, an etching process is conducted by using the patterned resist 86 as mask to remove the hard masks 45 and 46, the patterned material layer 44, and the patterned gate dielectric layer 42 of the gate structure 32 for forming a recess 90 exposing the SDB structure 18 underneath. After stripping the patterned resist 86, another etching process is conducted without using additional mask to remove the mask layer 84 or BARC completely and exposing the gate structures 30, 34 on the fin-shaped structure 14.

Figure 9:
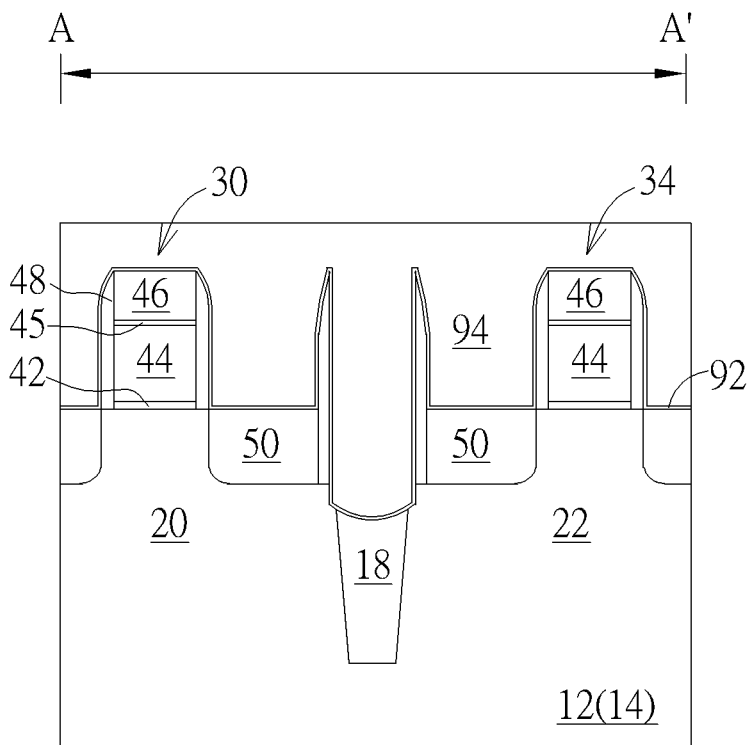

After removing the mask layer 84, as shown in FIG. 9, a contact etch stop layer (CESL) 92 is formed in the recess 90 and on the surface of the gate structure 30, 34 and the fin-shaped structure 14, and a dielectric layer 94 preferably serving as an ILD layer is formed on the gate structures 30, 34 and the CESL 92 to fill the recess 90 completely. Preferably, the CESL 92 is made of dielectric material having stress such as but not limited to for example silicon nitride (SiN) or silicon carbon nitride (SiCN) and the dielectric layer 94 is made of oxides such as silicon dioxide, but not limited thereto.

Figure 10:
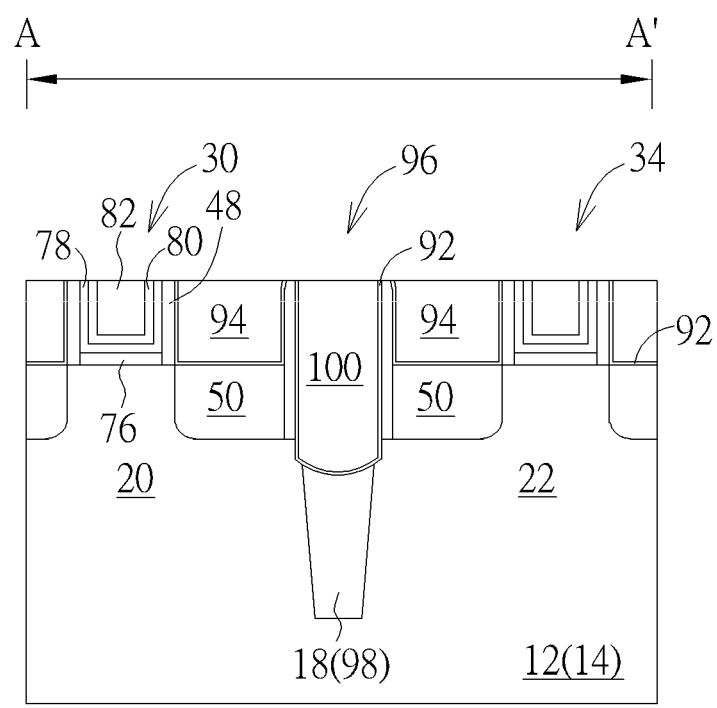

Next, as shown in FIG. 10, a planarizing process such as CMP is conducted to remove part of the dielectric layer 94 and part of the CESL 92 to form another SDB structure 96 between the gate structures 30, 34, in which the top surfaces of the SDB structure 96 and the dielectric layer 94 are coplanar.

Preferably, the new SDB structure 96 includes a bottom portion 98 embedded within the fin-shaped structure 14 and a top portion 100 on the bottom portion 98, in which a CESL 92 is disposed between the top portion 100 and the bottom portion 98. Similar to the aforementioned embodiment, the top portion 100 of the SDB structure 96 and the bottom portion 98 of the SDB structure 96 could be selected from the group consisting of $SiO_2$, SiOC, and SiN while the top portion 100 and the bottom portion 98 could be made of same material or different material.

After the new SDB structure 96 is formed, a replacement metal gate (RMG) process is conducted to transform the gate structures 30, 34 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 44 and even gate dielectric layer 42 from each of the gate structures 30, 34 for forming recesses (not shown) in the dielectric layer 94.

Next, a selective interfacial layer 76 or gate dielectric layer (not shown), a high-k dielectric layer 78, a work function metal layer 80, and a low resistance metal layer 82 are formed in the recesses, and a planarizing process such as CMP is conducted to remove part of low resistance metal layer 82, part of work function metal layer 80, and part of high-k dielectric layer 78 to form metal gates. Similar to the aforementioned embodiment, each of the gate structures 30, 34 or metal gates fabricated through high-k last process of a gate last process preferably includes an interfacial layer 76 or gate dielectric layer (not shown), a U-shaped high-k dielectric layer 78, a U-shaped work function metal layer 80, and a low resistance metal layer 82.

Figure 11:
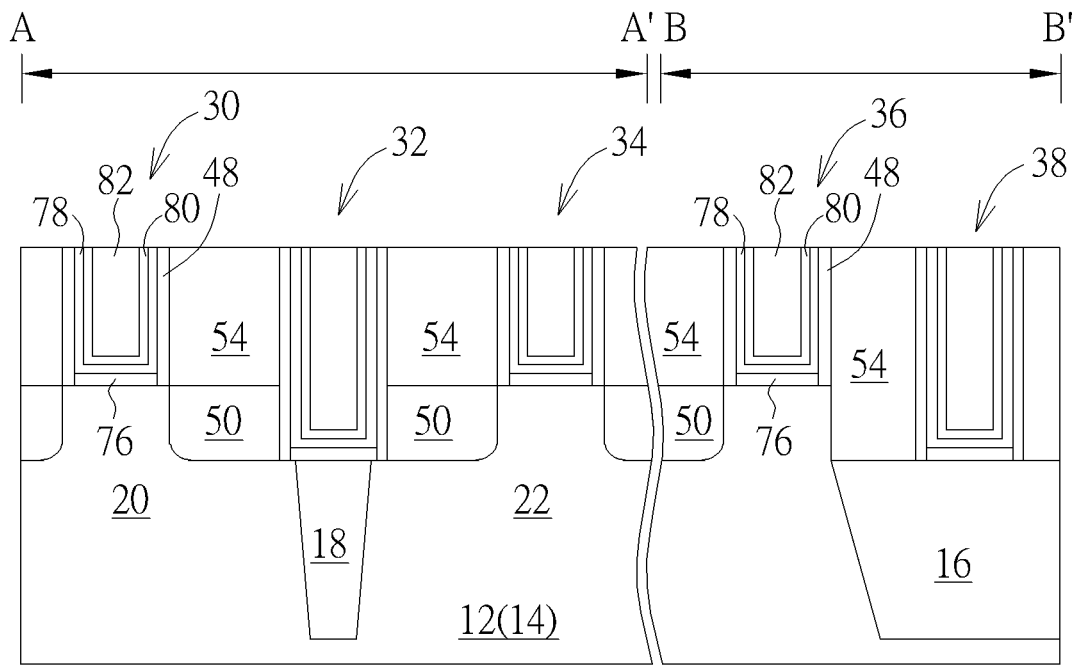
FIGS. 11-16 illustrate a method for fabricating a semiconductor device according to an embodiment of the present invention.

Referring to FIGS. 1-2 and 11-16, FIGS. 1-2 and 11-16 illustrate a method for fabricating semiconductor device according to an embodiment of the present invention, in which FIG. 1 is a top view illustrating a method for fabricating the semiconductor device, left portions of FIGS. 2 and 11-16 illustrate cross-sectional views of FIG. 1 for fabricating the semiconductor device along the sectional line AA', and right portions of FIGS. 11-16 illustrate cross-sectional views of FIG. 1 for fabricating the semiconductor device along the sectional line BB'. As shown in FIGS. 11, after forming the ILD layer 54 as shown in FIG. 2, a planarizing process such as CMP could be first conducted to remove part of the ILD layer 54 and then a replacement metal gate (RMG) process is conducted to transform the gate structures 24, 26, 28, 30, 32, 34, 36, 38, 40 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 46, the gate material layer 44 and even gate dielectric layer 42 from each of the gate structures 24, 26, 28, 30, 32, 34, 36, 38, 40 for forming recesses (not shown) in the ILD layer 54.

Next, a selective interfacial layer 76 or gate dielectric layer (not shown), a high-k dielectric layer 78, a work function metal layer 80, and a low resistance metal layer 82 are formed in the recesses, and a planarizing process such as CMP is conducted to remove part of low resistance metal layer 82, part of work function metal layer 80, and part of high-k dielectric layer 78 to form metal gates 24, 26, 28, 30, 32, 34, 36, 38, 40. In this embodiment, each of the gate structures or metal gates 24, 26, 28, 30, 32, 34, 36, 38, 40 fabricated through high-k last process of a gate last process preferably includes an interfacial layer 76 or gate dielectric layer (not shown), a U-shaped high-k dielectric layer 78, a U-shaped work function metal layer 80, and a low resistance metal layer 82. For simplicity purpose, only the metal gates 30, 32, 34, 36, 38 taken along the sectional lines AA' and BB' will be addressed in the following embodiments.

In this embodiment, the high-k dielectric layer 78 is preferably selected from dielectric materials having dielectric constant (k value) larger than 4. For instance, the high-k dielectric layer 78 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 80 is formed for tuning the work function of the metal gate in accordance with the conductivity of the device. For an NMOS transistor, the work function metal layer 80 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 80 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 80 and the low resistance metal layer 82, in which the material of the barrier layer may include titanium (Ti), titanium nitride (TiN), tantalum (Ta) or tantalum nitride (TaN). Furthermore, the material of the low-resistance metal layer 82 may include copper (Cu), aluminum (Al), titanium aluminum (TiAl), cobalt tungsten phosphide (CoWP) or any combination thereof.

Figure 12:
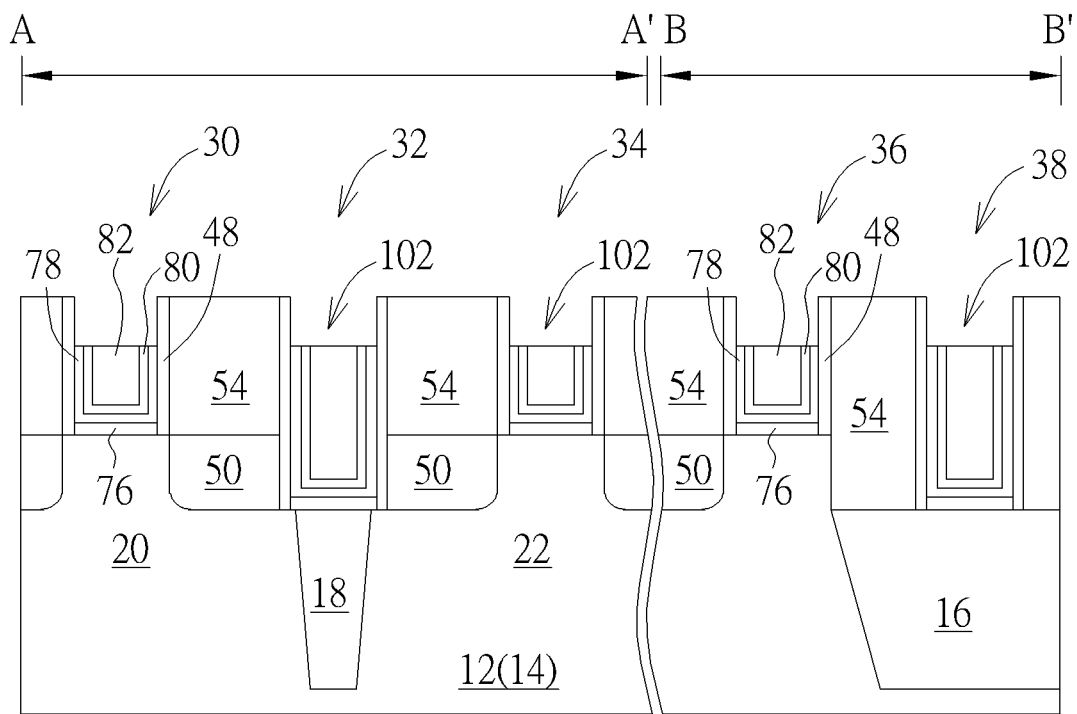

After forming the metal gates, as shown in FIG. 12, an etching back process could be conducted by using the ILD layer 54 as mask to remove part of the metal gates 30, 32, 34, 36, 38 to form recesses 102 in the ILD layer 54 and directly on top of the remaining metal gates 30, 32, 34, 36, 38.

Figure 13:
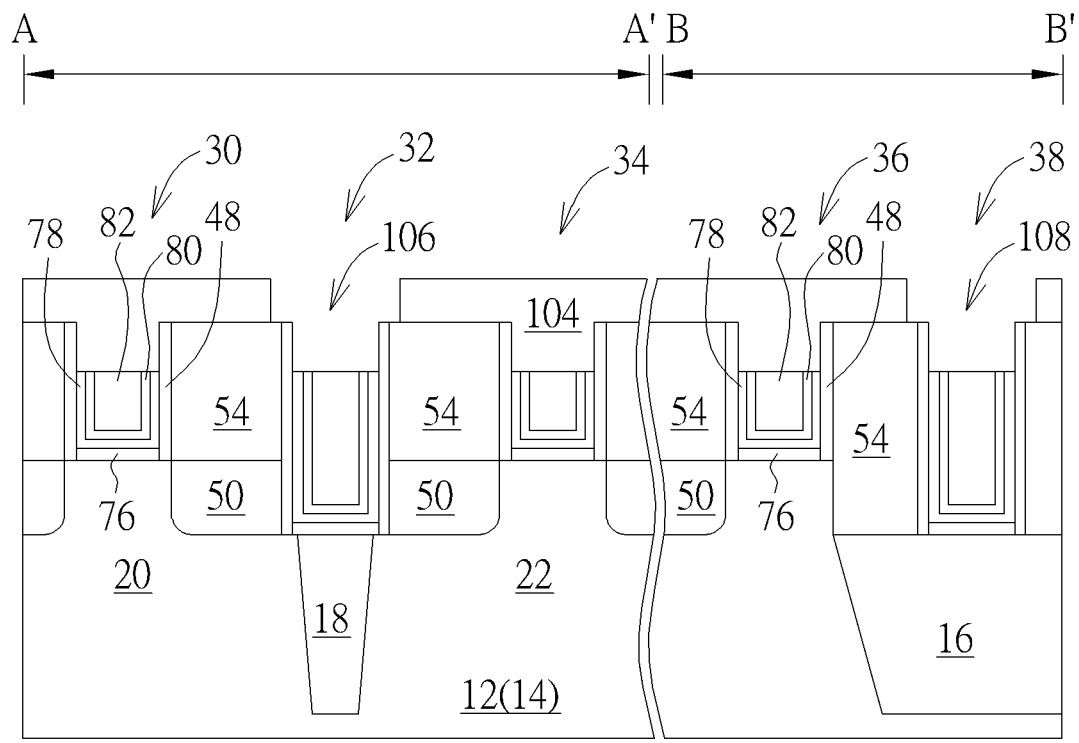

Next, as shown in FIG. 13, a patterned mask 104 such as a patterned resist is formed on the metal gates 30, 34, 36 and the ILD layer 54 and filled into the recesses 102 on top of the metal gates 30, 34, 36, in which the patterned mask 104 includes openings 106, 108 exposing the remaining metal gate 32, 38 and even part of the ILD layer 54 adjacent to the metal gates 32, 38.

Figure 14:
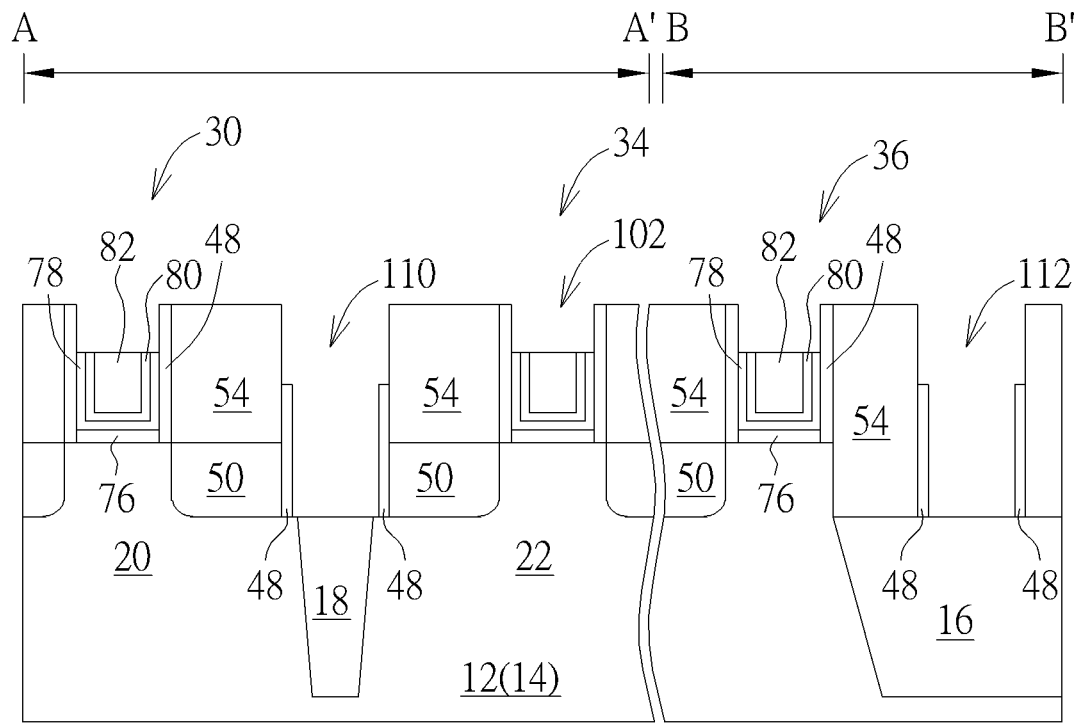

Next, as shown in FIG. 14, an etching process is conducted by using the patterned mask 104 as mask to remove part of the spacers 48 and all of the remaining metal gates 32, 38 on top of the SDB structure 18 and STI 16. This forms recesses 110, 112 in the ILD layer 54, in which the recess 110 exposes the SDB structure 18 underneath while the recess 112 exposes the STI 16 underneath. The patterned mask 104 is removed thereafter. Preferably, the etching process also removes part of the spacers 48 so that the top surface of the remaining spacers 48 while having a planar surface profile is slightly lower than the top surfaces of the ILD layer 54 and the spacers 48 adjacent to the metal gates 30, 34, 36 and the bottom surface of the remaining spacers 48 is substantially even with the bottom surface of the adjacent source/drain regions 50 and/or the top surface of the SDB structure 18.

Figure 15:
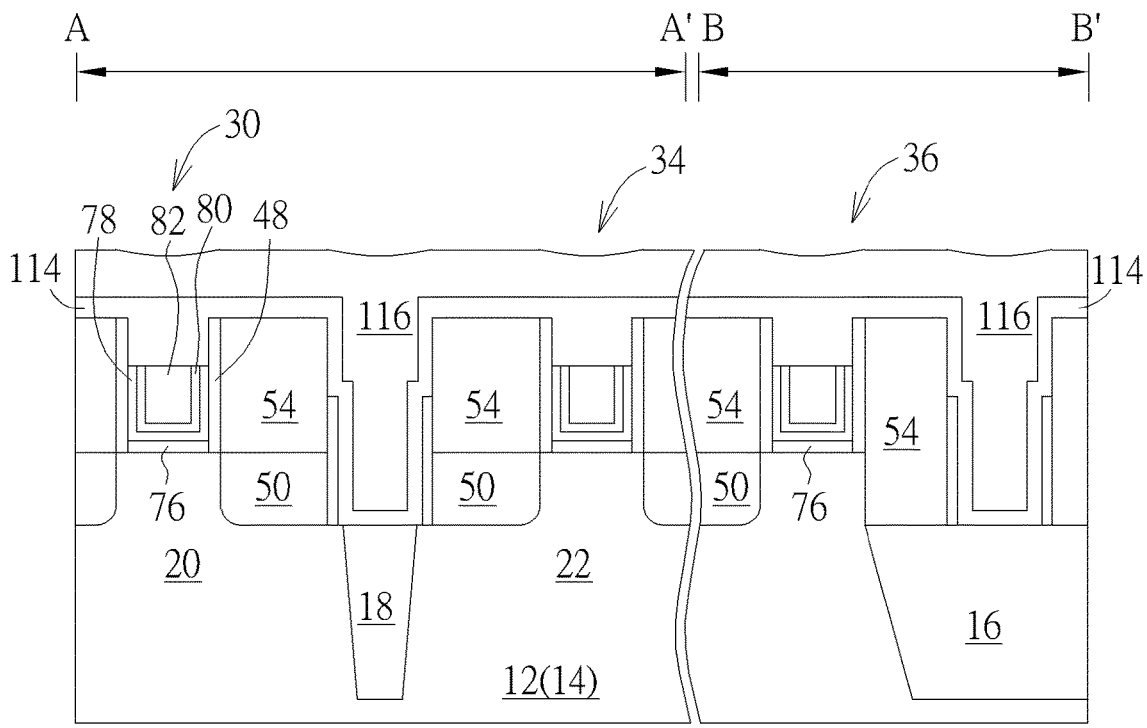

Next, as shown in FIG. 15, a cap layer 114 is formed on the ILD layer 54 and filled into the recesses 102 atop the metal gates 30, 34, 36 and the recesses 110, 112 at the same time. It should be noted that since the recesses 110, 112 on top of the SDB structure 18 and the STI 16 is much deeper than the recesses 102 on top of the metal gates 30, 34, 36, the deposition of the cap layer 114 preferably fills the recesses 102 above the metal gates 30, 34, 36 entirely while only fills part of the recesses 110, 112 on top of the SDB structure 18 and STI 16.

Next, a dielectric layer 116 is deposited on the cap layer 114 to fill the recesses 110, 112 directly above the SDB structure 18 and the STI 16 completely. Preferably, the cap layer 114 and the dielectric layer 116 are made of different materials, in which the cap layer 114 preferably includes silicon nitride (SiN) while the dielectric material 116 includes silicon oxide, but not limited thereto.

Figure 16:
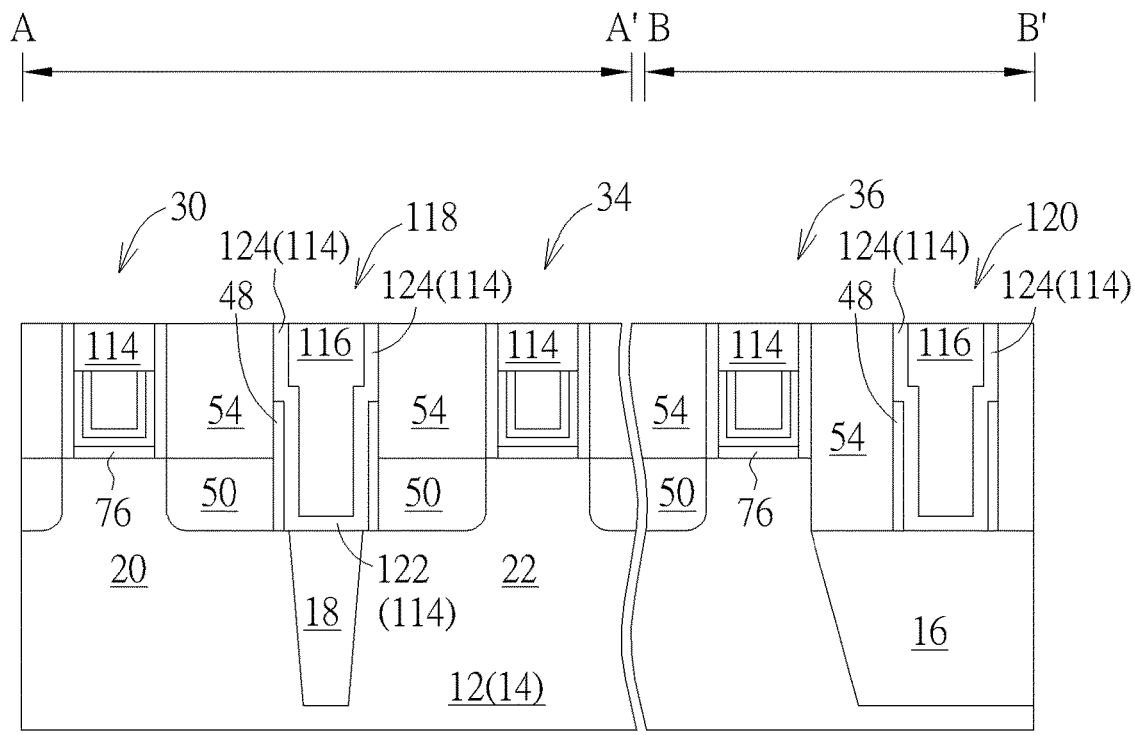

Next, as shown in FIG. 16, a planarizing process such as OH is conducted to remove part of the dielectric layer 116, part of the cap layer 114, and/or even part of the ILD layer 54 so that the top surfaces of the remaining dielectric layer 116 and the cap layer 114 are even with the top surface of the ILD layer 54. Preferably, the remaining cap layer 114 and dielectric layer 116 directly on top of the SDB structure 18 forms an isolation structure 118 and the remaining cap layer 114 and dielectric layer 116 on top of the STI 16 forms another isolation structure 120. This completes the fabrication of a semiconductor device according to an embodiment of the present invention.

Referring again to FIG. 16, FIG. 16 further illustrates a structural view of a semiconductor device according to an embodiment of the present invention. As shown in FIG. 16, the semiconductor device includes a SDB structure 18 dividing fin-shaped structure 14 into a first portion 20 and a second portion 22, a STI 16 around the fin-shaped structure 14, an isolation structure 118 disposed on the SDB structure 18, a spacer 48 around the isolation structure 118, another isolation structure 120 disposed on the STI 16, and another spacer 48 around the isolation structure 120, in which each of the isolation structures 118, 120 includes a T-shape if viewed from a cross-section perspective.

Preferably, each of the isolation structures 118, 120 includes a cap layer 114 on the SDB structure 18 and a dielectric layer 116 on the cap layer 114, in which the cap layer 114 includes a U-shape portion 122 and two L-shape portions 124 connected to the U-shape portion 122, sidewalls of the cap layer 114 or L-shaped portions 124 are aligned with sidewalls of the spacers 48, the dielectric layer 116 itself could include a T-shape cross-section, and the cap layer 114 and the dielectric layer 116 could constitute a T-shape cross-section altogether. Preferably, the cap layer 114 and the dielectric layer 116 are made of different dielectric materials, in which the cap layer 114 preferably includes silicon nitride and the dielectric layer 116 preferably includes silicon oxide.

Figure 17:
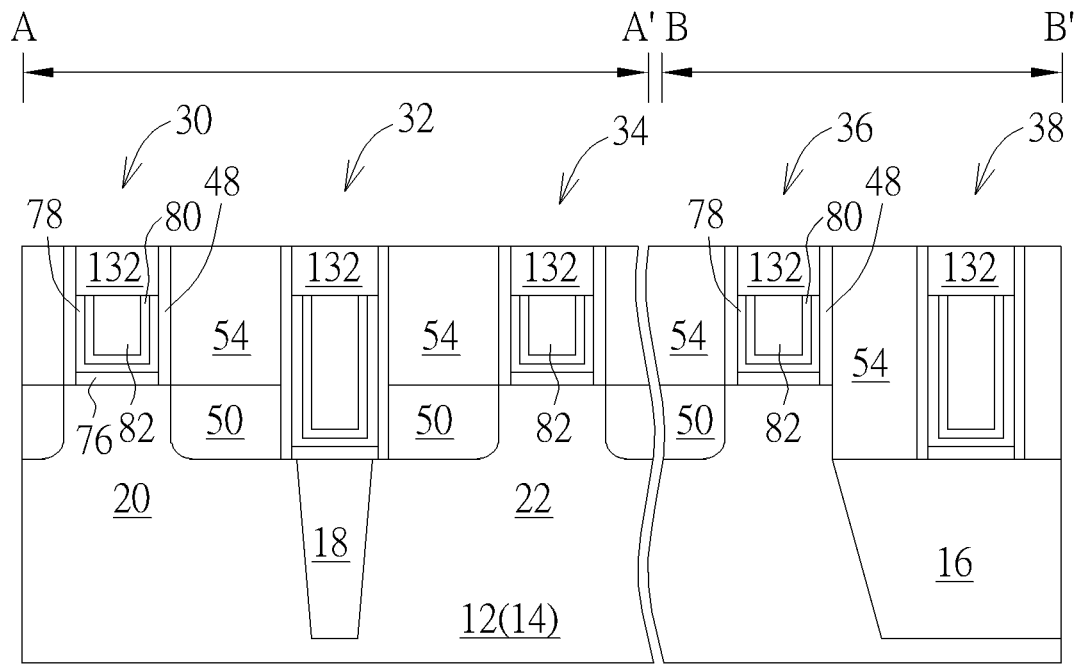
FIGS. 17-20 illustrate a method for fabricating a semiconductor device according to an embodiment of the present invention.

Referring to FIGS. 1-2 and 17-20, FIGS. 1-2 and 17-20 illustrate a method for fabricating semiconductor device according to an embodiment of the present invention, in which FIG. 1 is a top view illustrating a method for fabricating the semiconductor device, left portions of FIGS. 2 and 17-20 illustrate cross-sectional views of FIG. 1 for fabricating the semiconductor device along the sectional line AA', and right portions of FIGS. 17-20 illustrate cross-sectional views of FIG. 1 for fabricating the semiconductor device along the sectional line BB'. As shown in FIGS. 17, after forming the ILD layer 54 as shown in FIG. 2, a planarizing process such as CMP could be first conducted to remove part of the ILD layer 54 and then a replacement metal gate (RMG) process is conducted to transform the gate structures 24, 26, 28, 30, 32, 34, 36, 38, 40 into metal gates. For instance, the RMG process could be accomplished by first performing a selective dry etching or wet etching process using etchants including but not limited to for example ammonium hydroxide (NH$_4$OH) or tetramethylammonium hydroxide (TMAH) to remove the hard masks 46, the gate material layer 44 and even gate dielectric layer 42 from each of the gate structures 24, 26, 28, 30, 32, 34, 36, 38, 40 for forming recesses (not shown) in the ILD layer 54.

Next, a selective interfacial layer 76 or gate dielectric layer (not shown), a high-k dielectric layer 78, a work function metal layer 80, and a low resistance metal layer 82 are formed in the recesses, and a planarizing process such as CMP is conducted to remove part of low resistance metal layer 82, part of work function metal layer 80, and part of high-k dielectric layer 78 to form metal gates 24, 26, 28, 30, 32, 34, 36, 38, 40. In this embodiment, each of the gate structures or metal gates 24, 26, 28, 30, 32, 34, 36, 38, 40 fabricated through high-k last process of a gate last process preferably includes an interfacial layer 76 or gate dielectric layer (not shown), a U-shaped high-k dielectric layer 78, a U-shaped work function metal layer 80, and a low resistance metal layer 82. For simplicity purpose, only the metal gates 30, 32, 34, 36, 38 taken along the sectional lines AA' and BB' will be addressed in the following embodiments.

In this embodiment, the high-k dielectric layer 78 is preferably selected from dielectric materials having dielectric constant (k value) larger than 4. For instance, the high-k dielectric layer 78 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 80 is formed for tuning the work function of the metal gate in accordance with the conductivity of the device. For an NMOS transistor, the work function metal layer 80 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 80 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 80 and the low resistance metal layer 82, in which the material of the barrier layer may include titanium (Ti), titanium nitride (TiN), tantalum (Ta) or tantalum nitride (TaN). Furthermore, the material of the low-resistance metal layer 82 may include copper (Cu), aluminum (Al), titanium aluminum (TiAl), cobalt tungsten phosphide (CoWP) or any combination thereof.

Next, part of the metal gates 30, 32, 34, 36, 38 are removed to form recesses (not shown) in the ILD layer 54, and a cap layer 132 or hard mask is formed atop each of the remaining metal gates 30, 32, 34, 36, 38 so that the top surfaces of the cap layer 132 and the ILD layer 54 are coplanar. In this embodiment, the cap layer 132 is preferably made of dielectric material including but not limited to for example SiN.

Figure 18:
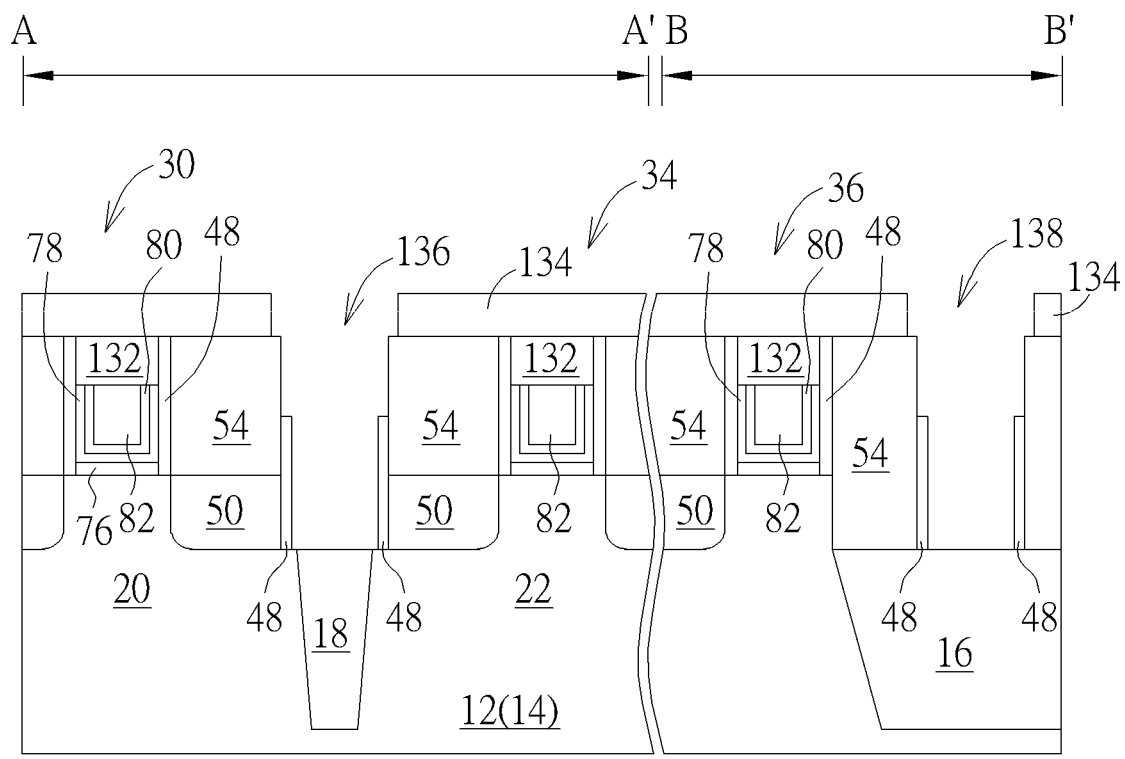

Next, as shown in FIG. 18, a patterned mask 134 such as a patterned resist is formed on the metal gates 30, 34, 36 and the ILD layer 54, in which the patterned mask 134 includes openings (not shown) exposing the cap layers 132 directly on top of the SDB structure 18 and the STI 16. Next, an etching process is conducted by using the patterned mask 134 as mask to remove part of the spacers 48, the cap layers 132 on the metal gates 32, 38, and remaining metal gates 32, 38 on top of the SDB structure 18 and STI 16. This forms recesses 136, 138 in the ILD layer 54, in which the recess 136 exposes the SDB structure 18 underneath while the recess 138 exposes the STI 16 underneath and the bottom surface of the recesses 136, 138 is substantially lower than the bottom surfaces of the adjacent metal gates 30, 34, 36 disposed on the fin-shaped structure 14. Similar to the aforementioned embodiment, the etching process also removes part of the spacer 48 so that the top surface of the remaining spacer 48 while having a planar surface profile is slightly lower than the top surfaces of the ILD layer 54 and the spacer 48 adjacent to the metal gates 30, 34, 36, and the bottom surface of the remaining spacer 48 is substantially even with the bottom surface of the adjacent source/drain regions 50 and/or the top surface of the SDB structure 18.

Figure 19:
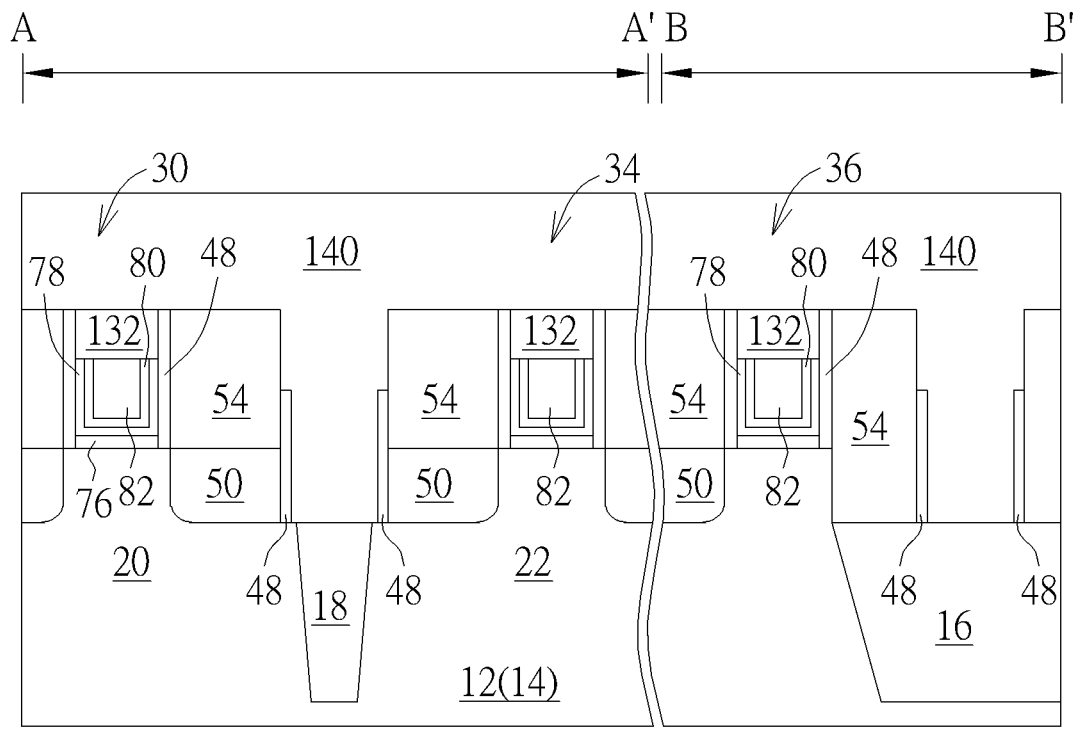

Next, as shown in FIG. 19, after stripping the patterned mask 134, a dielectric layer 140 is deposited on the metal gates 30, 34, 36, the ILD layer 54, and into the recesses 136, 138 to fill the recesses 136, 138 completely. Preferably, the dielectric layer 140 and the ILD layer 54 surrounding the metal gates 30, 34, 36 could be made of same material or different materials, in which both layers could be made of oxides including but not limited to for example silicon dioxide (SiO$_2$), silicon oxynitride (SiON), or tetraethyl orthosilicate (TEOS).

Figure 20:
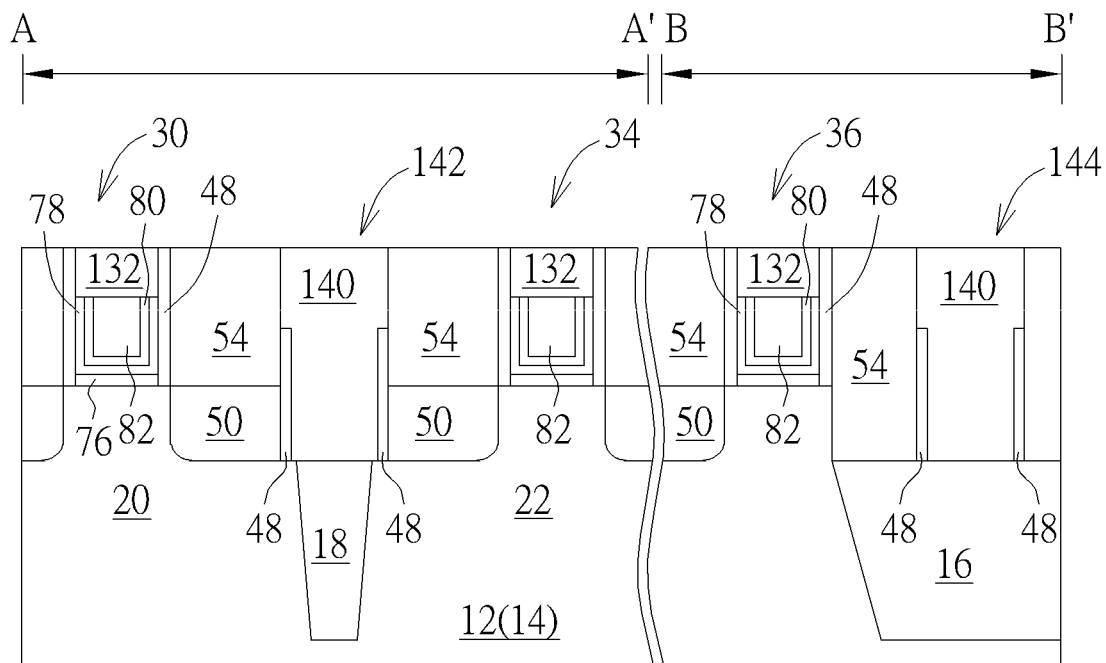

Next, as shown in FIG. 20, an optional planarizing process such as CMP process could be conducted to remove part of the dielectric layer 140 to form an isolation structure 142 on the SDB structure 18 and another isolation structure 144 on the STI 16, in which the top surface of the isolation structures 142, 144 is even with the top surface of the ILD layer 54. This completes the fabrication of a semiconductor device according to an embodiment of the present invention.

Referring again to FIG. 20, FIG. 20 further illustrates a structural view of a semiconductor device according to an embodiment of the present invention. As shown in FIG. 16, the semiconductor device includes a SDB structure 18 dividing fin-shaped structure 14 into a first portion 20 and a second portion 22, a STI 16 around the fin-shaped structure 14, an isolation structure 142 disposed on the SDB structure 18, a spacer 48 around the isolation structure 142, another isolation structure 144 disposed on the STI 16, and another spacer 48 around the isolation structure 142, in which each of the isolation structures 142, 144 includes a T-shape if viewed from a cross-section perspective.

Preferably, each of the isolation structures 142, 144 includes dielectric layer 140 on the SDB structure 18 and the STI 16, in which the dielectric layer 140 itself could include a T-shape cross-section, and sidewalls of the isolation structures 142, 144 are aligned with sidewalls of the spacers 48. Moreover, the bottom surface of the spacer 48 around the isolation structures 142, 144 is lower than the bottom surface of the spacer 48 around the metal gates 30, 34, 36, the top surface of the spacer 48 around the isolation structures 142, 144 is lower than the top surface of the spacer 48 around the metal gates 30, 34, 36 and higher than the bottom surface of the spacer 48 around the metal gates 30, 34, 36. Preferably, the dielectric layer 140 and the ILD layer 54 could be made of same or different dielectric materials while both the dielectric layer 140 and the ILD layer 54 could include dielectric materials including but not limited to for example silicon oxide, silicon oxynitride, TEOS, or combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a single diffusion break (SDB) structure dividing a fin-shaped structure into a first portion and a second portion; and an isolation structure on the SDB structure, wherein the isolation structure comprises a T-shape, a bottom surface of the isolation structure is lower than a top surface of the fin-shaped structure, and the isolation structure further comprising:
  a cap layer on the SDB structure, wherein the cap layer is made of a dielectric material; and
  a dielectric layer on the cap layer.

2. The semiconductor device of claim 1, wherein the dielectric layer comprises the T-shape.

3. The semiconductor device of claim 1, wherein the cap layer and the dielectric layer comprise the T-shape altogether.

4. The semiconductor device of claim 1, wherein the cap layer comprises a U-shape.

5. The semiconductor device of claim 1, wherein the cap layer and the dielectric layer comprise different materials.

* * * * *